(12) United States Patent
Zahradka et al.

(10) Patent No.: US 11,517,942 B2
(45) Date of Patent: Dec. 6, 2022

(54) CLEANING METHOD

(71) Applicant: Edwards, S.R.O., Lutin (CZ)

(72) Inventors: Martin Zahradka, Lutin (CZ);
Miroslav Strasil, Lutin (CZ)

(73) Assignee: Edwards, S.R.O., Lutin (CZ)

( * ) Notice: Subject to any disclaimer, the term of this patent is extended or adjusted under 35 U.S.C. 154(b) by 0 days.

(21) Appl. No.: 16/483,992

(22) PCT Filed: Feb. 12, 2018

(86) PCT No.: PCT/EP2018/053449
§ 371 (c)(1),
(2) Date: Aug. 6, 2019

(87) PCT Pub. No.: WO2018/146312
PCT Pub. Date: Aug. 16, 2018

(65) Prior Publication Data
US 2020/0094297 A1 Mar. 26, 2020

(30) Foreign Application Priority Data
Feb. 13, 2017 (GB) ..................... 1702337

(51) Int. Cl.
*B08B 7/00* (2006.01)
*B08B 5/00* (2006.01)
(Continued)

(52) U.S. Cl.
CPC .............. *B08B 7/0035* (2013.01); *B08B 5/00* (2013.01); *F04C 25/02* (2013.01);
(Continued)

(58) Field of Classification Search
None
See application file for complete search history.

(56) References Cited

U.S. PATENT DOCUMENTS 5,314,541 A * 5/1994 Saito .................... C23C 14/566
118/725
5,328,557 A 7/1994 Blalock
(Continued)

FOREIGN PATENT DOCUMENTS

| CN | 101497982 A | 8/2009 |
|----|-------------|--------|
| CN | 101724843 A | 6/2010 |

(Continued)

OTHER PUBLICATIONS

JPS6314866 English Translation, accessed on Sep. 2022. (Year: 1988).*

(Continued)

*Primary Examiner* — Eric W Golightly
*Assistant Examiner* — Arlyn I Rivera-Cordero
(74) *Attorney, Agent, or Firm* — Theodore M. Magee; Westman, Champlin & Koehler, P.A.

(57) ABSTRACT

The present invention provides a method for cleaning a component for use in an ultra-high vacuum. The method may comprise the steps of placing the component to be cleaned in a vacuum furnace chamber; plasma cleaning the component at a temperature of greater than about 80° C.; and evacuating the chamber to a pressure of less than about 10E-5 mbar. Apparatus for performing such methods and kits comprising said components are also provided.

13 Claims, 3 Drawing Sheets

(51) Int. Cl.
  *F04C 25/02* (2006.01)
  *F04C 29/00* (2006.01)
  *H01J 37/32* (2006.01)

(52) U.S. Cl.
  CPC .... *F04C 29/0092* (2013.01); *H01J 37/32816* (2013.01); *H01J 37/32853* (2013.01); *B08B 2205/00* (2013.01); *H01J 2237/002* (2013.01); *H01J 2237/335* (2013.01)

(56) References Cited

U.S. PATENT DOCUMENTS

| | | | | |
|---|---|---|---|---|
| 6,841,008 | B1* | 1/2005 | Branco | B08B 3/12 134/1.1 |
| 2008/0216865 | A1* | 9/2008 | Ishihara | H01J 37/3244 134/1.2 |
| 2013/0255717 | A1 | 10/2013 | Rose et al. | |
| 2014/0083453 | A1* | 3/2014 | Yin | H01J 37/32862 134/1.1 |
| 2014/0238438 | A1* | 8/2014 | Segev | H01J 37/02 134/1.1 |

FOREIGN PATENT DOCUMENTS

| | | |
|---|---|---|
| CN | 102899636 A | 1/2013 |
| CN | 104040708 A | 9/2014 |
| CN | 105575767 A | 5/2016 |
| JP | 6314866 U | 1/1988 |
| JP | 404369223 A | 12/1992 |
| JP | H08288247 A | 11/1996 |
| JP | 411507990 A | 7/1999 |
| JP | 2002141291 A | 5/2002 |
| JP | 2003234068 A | 8/2003 |
| JP | 200411959 A | 4/2004 |
| JP | 2004119595 A | 4/2004 |
| KR | 20110043018 A | 4/2011 |
| WO | 2006082724 A1 | 8/2006 |

OTHER PUBLICATIONS

British Examination Report dated May 31, 2017 and Search Report dated May 30, 2017 for corresponding British application Serial No. GB1702337.5, 4 pages.
PCT International Search Report and Written Opinion dated May 24, 2018 for corresponding PCT application Serial No. PCT/EP2018/053449.
Henniker Plasma, Solvent Cleaning Technique Plasma Cleaning for UHV Applications: Particles Accelerators Hyper-clean Surfaces Other Essential Features of the Experiment were: (mass 28) for ESD Calibrated Pressure Measurement Sample Drain Current Measured during ESD Ion Gauge P2 Ion Gauge P1 RGA Sample Area of Sample, http://plasmatreatment.co.uk/wp-content/uploads/2013/09/daresbury_labs_CS.1.pdf, Sep. 1, 2013, 2 pages.
Halliday, Cleaning materials and components for vacuum use, Vacuum, vol. 37, Nos. 8 and 9, pp. 587-591, 1987.
First Office Action and Search Report dated Jan. 1, 2021 for corresponding Chinese application Serial No. 201880011657.4, 12 pages.
Communication dated Sep. 22, 2020 for corresponding European application Serial No. EP18711480.6-1211, 7 pages.
Japanese Notification of Reason for Rejection dated Dec. 22, 2021 for corresponding Japanese application Serial No. JP2019-543273, 6 pgs.
Second Office Action dated Sep. 28, 2021 for corresponding Chinese application Serial No. CN201880011657.4, 15 page.
Japanese Notification of Reason for Rejection dated Aug. 24, 2022 for corresponding Japanese application Serial No. JP2019-543273, 5 pgs.
Korean Reasons for Rejections dated Sep. 30, 2022 for corresponding Korean application Serial No. KR2019-7023543, 10 pages.

* cited by examiner

CLEANING METHOD

CROSS-REFERENCE OF RELATED APPLICATION

This application is a Section 371 National Stage Application of International Application No. PCT/EP2018/053449, filed Feb. 12, 2018, and published as WO 2018/146312 A1 on Aug. 16, 2018, the content of which is hereby incorporated by reference in its entirety and which claims priority of British Application No. 1702337.5, filed Feb. 13, 2017.

FIELD

The present invention relates to methods and apparatuses for cleaning components for use in an ultra-high vacuum (UHV).

BACKGROUND

When surfaces are placed under vacuum, gas evolves from their surfaces. The generation of gas by this process is known as outgassing. Outgassing becomes a progressively significant proportion of the total gas load once a chamber is roughed down to below 0.1 mbar. For ultra-high vacuum systems ($10^{-7}$ mbar or less), outgassing is the most important factor influencing degassing and the time to ultimate pressure.

Outgassing can be reduced by eliminating elastomer, hydrocarbon oil and greases from the vacuum pumps; avoiding other materials known to have poor outgassing performance, such as mild steel or porous surfaces; baking components under vacuum; and using clean-room techniques to avoid contamination.

Even employing such approaches, hydrocarbon contamination can still occur. Without being bound by theory, it is believed that the unwanted hydrocarbons may be introduced during casting and machining of metallic components (e.g. cutting fluids). Currently solvents are used to reduce hydrocarbon contamination; however, it is currently impossible to eliminate such contamination completely by such an approach. Thus, UHV apparatus manufacturers or users may have to run vacuum pumps for 72 hours or more before they can reach ultimate pressure. Such delays are costly and inconvenient. Moreover, any residual hydrocarbon contamination can be particularly problematic in specific UHV applications, such as mass spectrometry, where their presence may ruin equipment or provide false results.

There is therefore a need for improved methods and apparatus for cleaning ultra-high vacuum components that address these and other problems with the prior art.

The discussion above is merely provided for general background information and is not intended to be used as an aid in determining the scope of the claimed subject matter. The claimed subject matter is not limited to implementations that solve any or all disadvantages noted in the background.

SUMMARY

Accordingly, in a first aspect, the invention provides a method for cleaning a component for use in an ultra-high vacuum and, in particular, a component or components of an ultra-high vacuum pump.

The method may comprise the steps of placing the component to be cleaned in a vacuum furnace chamber; plasma cleaning the component at a temperature of greater than about 80° C., preferably from about 80° C. to about 125° C., more preferably from about 100° C. to about 120° C.; and evacuating the chamber to a pressure of less than about 10E-5 mbar, preferably less than 10E-6 mbar.

In embodiments, the method may include the step of evacuating the chamber to a pressure of less than about 10E-5 mbar, preferably to 10E-6 mbar or less, before the plasma cleaning step commences, preferably the chamber is evacuated to such an extent both before and after the plasma cleaning step. An initial evacuation step is advantageous because it ensures that the plasma forming gas is not significantly contaminated by atmospheric gasses.

Method steps will typically be performed sequentially within a single vacuum furnace. Preferably, the vacuum furnace will itself be located within a clean room. Typically, the samples may not leave the vacuum furnace until the method is complete.

When the plasma cleaning step is finished the elevated temperature of the component (e.g. at least 80° C.) results in accelerated outgassing therefrom. Accordingly, it is advantageous to evacuate the chamber to an ultimate pressure (e.g. 10E-6 mbar or below) before the parts are cooled. Additionally, or alternatively, the component may be held at the ultimate pressure of the vacuum furnace for an extended period of outgassing and cooling. In embodiments, this may take from about 2 to about 4 hours depending on the size of the components.

Additionally, or alternatively, the method may further comprise repeatedly plasma cleaning and evacuating the chamber, typically from about 5 to about 25 cycles may be performed, more preferably from about 8 to 12 cycles. One example is 10 cycles. The number of cycles that are performed determines the cleanliness of the component. Therefore, the use of the component may determine the number of cycles employed. For instance, if a user requires a component that is substantially free from hydrocarbon contamination for use in a vacuum with an ultimate pressure of approximately 10E-6 mbar, then only one cycle may be employed. Alternatively, if the user requires a component suitable for use in a vacuum pump capable of an ultimate pressure of 10E-11 mbar, then 10 cycles may be employed, with each cycle including 2 hours or more of outgassing and slow cooling at the ultimate pressure of the Components treated using the latter method are both substantially hydrocarbon-free and very well degassed.

Treating components according to the method of the invention has been found to significantly reduce hydrocarbon contamination and allow ultra-high vacuums to reach ultimate pressure significantly more quickly, compared to when untreated components are employed.

For the purpose of the invention, component includes the plural components. Typically, the component will be a component that is exposed to an ultra-high vacuum when in use, or is used in generating an ultra-high vacuum, including components of the vacuum chamber, vacuum pump, and/or vacuum gauge of an ultra-high vacuum assembly. Vacuum assembly components may be selected from the group consisting of stators, rotors, bladed discs, distance rings, bodies, envelopes, ports, and the like. Additionally, or alternatively, the component may be a component intended for use within an ultra-high vacuum. Components intended for use in a vacuum assembly may be selected from the group consisting of piping, headers, chambers; valves, and the like. Typically, the component will be metallic, for instance a titanium alloy, aluminium alloy, or a stainless steel.

Further, the method may include a pre-cleaning step in which the component is cleaned with a solvent before it is placed in the vacuum furnace. Advantageously, this removes any dust and/or the bulk of any contaminants from the manufacturing process, such as cutting fluids, and leaves only a very thin film (one or two molecular layers) of remains on the surface.

Plasma cleaning has its normal meaning. That is to say, the removal of impurities and contaminants from a surface through the exposure of that surface to a plasma created from gaseous species. In the plasma cleaning step, typically, the gas used to form the plasma enters the chamber. Typically, the gas is selected from the group consisting of oxygen, air, nitrogen, helium and argon. Oxygen is particularly preferred because it and the oxygen species created in the plasma are effective in the breaking of most organic bonds (e.g. C—H, C—C, C=C, C—O, and C—N) of hydrocarbon contaminants, and in particular breaking apart high molecular weight contaminants. The oxygen species formed in the plasma react with organic contaminants to form products including $H_2O$, CO, $CO_2$, and lower molecular weight hydrocarbons.

Typically, the plasma generator provides a voltage frequency of from about 1 kHz to about 50 kHz, preferably from about 20 kHz to about 40 kHz.

The products of the plasma cleaning may be removed constantly throughout the plasma cleaning step and/or are evacuated from the chamber during the evacuation step. If the component comprises an easily oxidised material, then helium or argon may be used.

Typically, the gas used to form the plasma (i.e. the working gas) is introduced to a pressure of from about 0.1 mbar to about 1 mbar, preferably about 0.5 mbar. Typically, the gas is introduced at flow rate of less than about 100 sccm, preferably less than about 50 sccm, preferably from about 5 sccm to about 20 sccm, preferably about 10 sccm. The flow rate and pressure may be maintained throughout the plasma cleaning with the vacuum pump removing gas from the chamber, including the products of the plasma cleaning. For the avoidance of doubt, sccm is Standard Cubic Centimetres per Minute.

Unless otherwise stated, measurements are made at standard temperature and pressure (STP) as a temperature of 273.15° K. (0° C., 32° F.) and an absolute pressure of exactly 100 kPa (1 bar).

Typically, the vacuum furnace chamber has a volume of from about 200 litres to about 1000 litres, preferably from about 250 litres to about 500 litres, preferably about 300 litres. Chambers of this size are advantageous because they allow the batch cleaning of multiple components, and allow the plasma and reaction products to flow easily throughout the chamber. It will however be appreciated that significantly smaller or larger chambers could be used without departing from the invention.

Additionally, or alternatively, the vacuum furnace chamber is equipped with a pump that can maintain a pressure of less than about 10E-6 mbar, more preferably less than about 10E-7 mbar. The pump may be any suitable vacuum pump, including a turbomolecular pump. Preferably the vacuum furnace chamber is leak-tight to a pressure of less than about 10E-8 mbar.

Typically, the evacuation step is followed by a cooling step in which the component and/or vacuum furnace chamber is cooled and dry nitrogen is introduced into the vacuum furnace chamber, typically the nitrogen is introduced into the chamber before the chamber temperature drops below about 50° C. Purging the vacuum furnace chamber with nitrogen advantageously maintains a dry atmosphere, preventing condensation and avoiding vapour mists from forming. Typically, the component may be removed from the vacuum furnace chamber once it is at ambient temperature (e.g. about 20° C.)

Additionally, or alternatively, when the process includes multiple plasma cleaning cycles, a plasma cleaning step of a subsequent cycle may be started before the temperature has cooled below 50° C., thereby avoiding the need for purging the vacuum furnace with nitrogen between each cycle.

In embodiments, the vacuum furnace chamber includes both means for heating and cooling the component so that the temperature can be maintained at or below 125° C. during each step of the process. Above 125° C. aluminium components may degrade and without means for cooling the component the temperature could rise above this temperature during the plasma cleaning. Suitable heating means may be selected from the group consisting of plasma heating, or radiation heating from the chamber surface. Additionally, or alternatively, suitable cooling means may be selected from the group consisting of shelf cooling (e.g. by a closed oil circuit) or purge gas flow through the vacuum furnace chamber.

Typically, the method will be automated. That is to say, the method will include a predetermined number of plasma cleaning and evacuation steps (for instance 10), and/or the length of the plasma cleaning and/or evacuation steps is predetermined. The required number and length of steps can be determined by routine experiments measuring the amount of organic matter present in the evacuated gasses and/or the time taken to reach the cleaned-component-containing vacuum's ultimate pressure. The method is typically used to clean unused components before their first use.

Typically, the plasma cleaning lasts less than about 1 hour, preferably less than about 45 minutes, more preferably from about 15 minutes to about 35 minutes. The cleaning method may last, in total, less than about 1 hour from start to finish, preferably less than about 45 minutes, more preferably from about 15 minutes to about 40 minutes.

In further aspect, the invention provides a vacuum furnace for cleaning a component for use in an ultra-high vacuum, the vacuum furnace comprising a vacuum chamber comprising a vacuum pump configured to maintain a pressure of less than about 10E-6 mbar and a plasma generator. Preferably the vacuum furnace is configured to maintain the component to be cleaned at a temperature of greater than about 80° C., preferably from about 80° C. to about 125° C., whilst the component is exposed to a plasma generated in the chamber.

The vacuum furnace may be configured to switch between a plasma cleaning phase in which the component to be cleaned is exposed to a plasma and a second evacuation phase in which the vacuum pump lowers the pressure in the chamber, preferably to a pressure of less than about 10E-6 mbar.

The chamber may contain an oxygen, air, nitrogen, helium, or argon plasma, preferably an oxygen plasma.

The vacuum furnace chamber may have a volume of greater than 200 litres, preferably from about 200 litres to about 1000 litres, preferably from about 250 litres to about 400 litres.

In a further aspect, the invention provides a kit for assembling into a vacuum pump, the kit comprising a plurality of unassembled unused vacuum pump components wherein one or more of said components has been cleaned according to a method of the invention. Such kits advantageously allow the assembly of a vacuum pump that is substantially free from hydrocarbon contaminants and may be able to reach its ultimate pressure in a significantly reduced time compared to an otherwise cleaned pump.

The invention further provides, the use of a plasma to clean a component of a vacuum in a vacuum furnace at a temperature of greater than about 80° C. preferably from about 80° C. to about 125° C.

In further aspect the invention provides an ultra-high vacuum assembly wherein upon its first use the assembly's ultimate pressure is achieved in less than 48 hours. Typically, the ultra-high vacuum assembly has an ultimate pressure of about 10E-7 mbar or less, preferably 10E-8 mbar or less, preferably from about 10E-7 mbar to about 10E-11 mbar.

In a further aspect the invention provides an ultra-high vacuum assembly wherein upon its first use the partial pressure of $C_4H_7$ is less than 1.00E-11 Torr after less than 30 minutes. Typically as measured on a residual gas analysers (RGA) [e.g. Hiden Analytical HAL201] with an ultra-high vacuum of 10E -8 mbar obtained. Preferably, wherein upon its first use the partial pressure of AMU55 ($C_4H_7$) at 2 hours is less than about 1.00E-12 Torr.

Additionally, or alternatively, the invention provides an ultra-high vacuum pump wherein upon its first use the partial pressure of AMU55 ($C_4H_7$) at 4 hours is less than about 1.00E-13 Torr, preferably 1.00E-14 Torr or less.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

BRIEF DESCRIPTION OF THE DRAWINGS

Preferred features of the present invention will now be described, by way of example, with reference to the accompanying figures, in which.

DETAILED DESCRIPTION

The present invention provides a method for cleaning a component for use in an ultra-high vacuum. The method comprises the steps of placing the component to be cleaned in a vacuum furnace chamber; plasma cleaning the component at a temperature of greater than about 80° C., preferably from about 80° C. to about 125° C.; and evacuating the chamber to a pressure of less than about 10E-5 mbar, preferably less than about 10E-06 mbar. The invention further provides a vacuum furnace for use in the method.

For the purpose of the invention a vacuum furnace is a temperature controlled vacuum chamber. As discussed elsewhere in the application, the chamber may include both heating and cooling elements so that the chamber and/or component to be cleaned can be maintained at a predetermined temperature or within a predetermined temperature range. Heating is typically provided by the plasma itself, whereas cooling is, typically, used at the end of the process to facilitate removing the parts from the vacuum furnace. The temperature of the vacuum furnace chamber may be monitored by a probe with an exchangeable radiation absorber, whereas each rig within the chamber that holds a component may also have their temperature monitored by optical cable. Typically, heating will be automatically stopped when a desired temperature is reached. The chamber surface may also be monitored by separate temperature probe.

Figure 1:
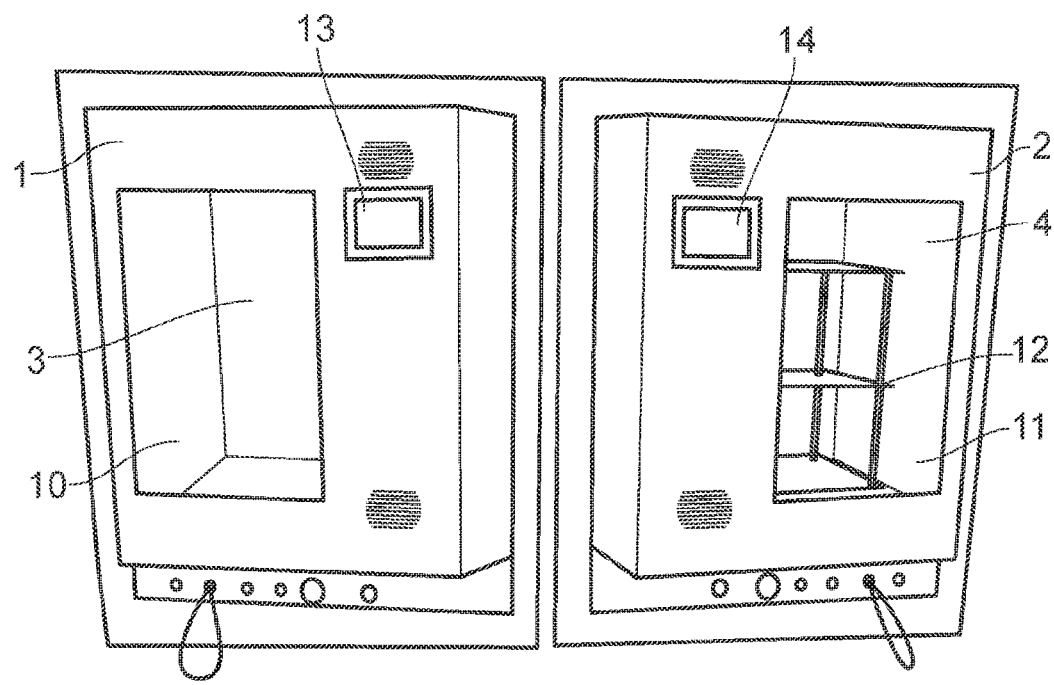
FIG. 1 discloses a vacuum furnace according to the invention.
Figure 2:
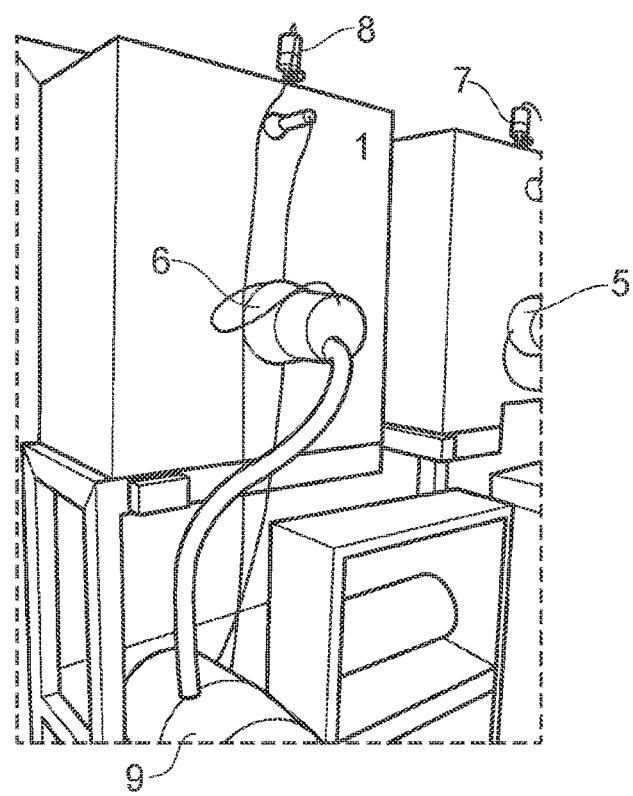
FIG. 2 discloses a vacuum furnace according to the invention.

FIGS. 1 and 2 show front and rear views of two vacuum furnaces (1, 2) according to the invention. The vacuum furnaces (1, 2) are located in a clean room. Each vacuum furnace includes a vacuum chamber (3, 4), a turbomolecular pump (5, 6), and a plasma generator (7, 8). A rotary pump (9) is connected to the turbomolecular pump (6) for quickly pumping down the chamber (4) to a rough vacuum during evacuation steps before the chamber (4) is evacuated to ultra-vacuum pressures. Suitable turbomolecular pumps are available from Edwards Vacuums™. Suitable vacuum furnaces are available from Termobit™. The vacuum furnace further comprises a temperature probe for monitoring the temperature within the chamber, and heating and cooling elements (not shown) for controlling the temperature within the vacuum furnace, in particular during the plasma cleaning step.

The illustrated vacuum chambers further comprise observation windows (10, 11) for viewing the content of the chambers (3, 4) during the process of the invention. The second vacuum furnace (2) contains a shelving unit (12) onto which components are placed for cleaning. The vacuum chambers (3, 4) are leak-tight to a pressure of less than about 10E-8 mbar.

The illustrated vacuum furnaces further comprise displays (13, 14) for controlling the vacuum furnaces (1, 2) and/or indicating the progress of the vacuum furnace (1, 2) during the cleaning process. Typically, the vacuum furnace (1, 2) performs the cleaning process automatically with each step being performed for a predetermined length of time in predetermined sequence. Typically, the user will make a single "start" input to initiate the process. The vacuum furnace will then perform the cleaning process and indicate to the user by a visual and/or audible signal that the process is complete. The cleaned components may then be employed in an ultra-high vacuum. The length and sequence of steps required to clean specific components adequately can be determined by experimentation and may vary depending upon plasma power and flow, temperature, evacuation pressure, the initial amount of hydrocarbon contamination and/or the level of cleanliness required.

The working gas (e.g. oxygen) used to form the plasma enters the chamber through a flow-controlled vent (not shown). The nitrogen used for purging the vacuum furnace once the evacuation step is complete enters through a separate vent (not shown).

The invention will now be described with reference to the example, which is not intended to be limiting.

EXAMPLE

A purpose built vacuum furnace per the invention was assembled. The vacuum furnace comprised a 300 litre vacuum chamber [Termobit™], turbomolecular pump [Edwards™ Plasma Purifier 300 Twin], plasma generator, and a temperature control system.

In a clean room, the previously unused rotors and stators of four Edwards™ nEXT™ turbomolecular pumps were cleaned using CHEMACID 5000; USF3 to remove dust, cutting agents and other surface contamination.

The components of two of the turbomolecular pumps were then placed inside the vacuum furnace. The chamber was sealed and evacuated to 10E-6 mbar to remove the air from the chamber. The chamber was then filled with working gas (oxygen) to a pressure of 0.5 mbar and the sample was plasma cleaned at a flow rate of 10 sscm for 30 minutes at an elevated temperature of 80° C. with the plasma generator set to a frequency of 35 kHz and 3 kW of power.

Following the plasma cleaning, the chamber was evacuated to 1E-06 mbar to remove the working gas. Once the chamber was so evacuated, the sample was cooled and nitrogen was introduced into the chamber before the temperature of the chamber dropped below about 50° C. When the chamber was at atmospheric pressure and room temperature, the vacuum chamber was opened and the clean components removed.

Edwards™ nEXT™ Turbomolecular pumps were then assembled: some with plasma cleaned components, others with untreated components. All were connected to separate vacuum chambers that were leak-tight to 10E-8 mbar.

Of the turbomolecular pumps, two (one plasma cleaned, one untreated) were then each connected to a separate gas-chromatographer/mass-spectrometer (GCMS) [2010 Plus and 2010 Ultra] and the remaining two were each connected to separate residual gas analysers (RCA) [Hiden Analytical HAL201]. The turbomolecular pumps were then initiated and an ultra-high vacuum of 10E-8 mbar obtained. The GCMS and RCA monitored the output of the pumps as they degassed.

Figure 3:
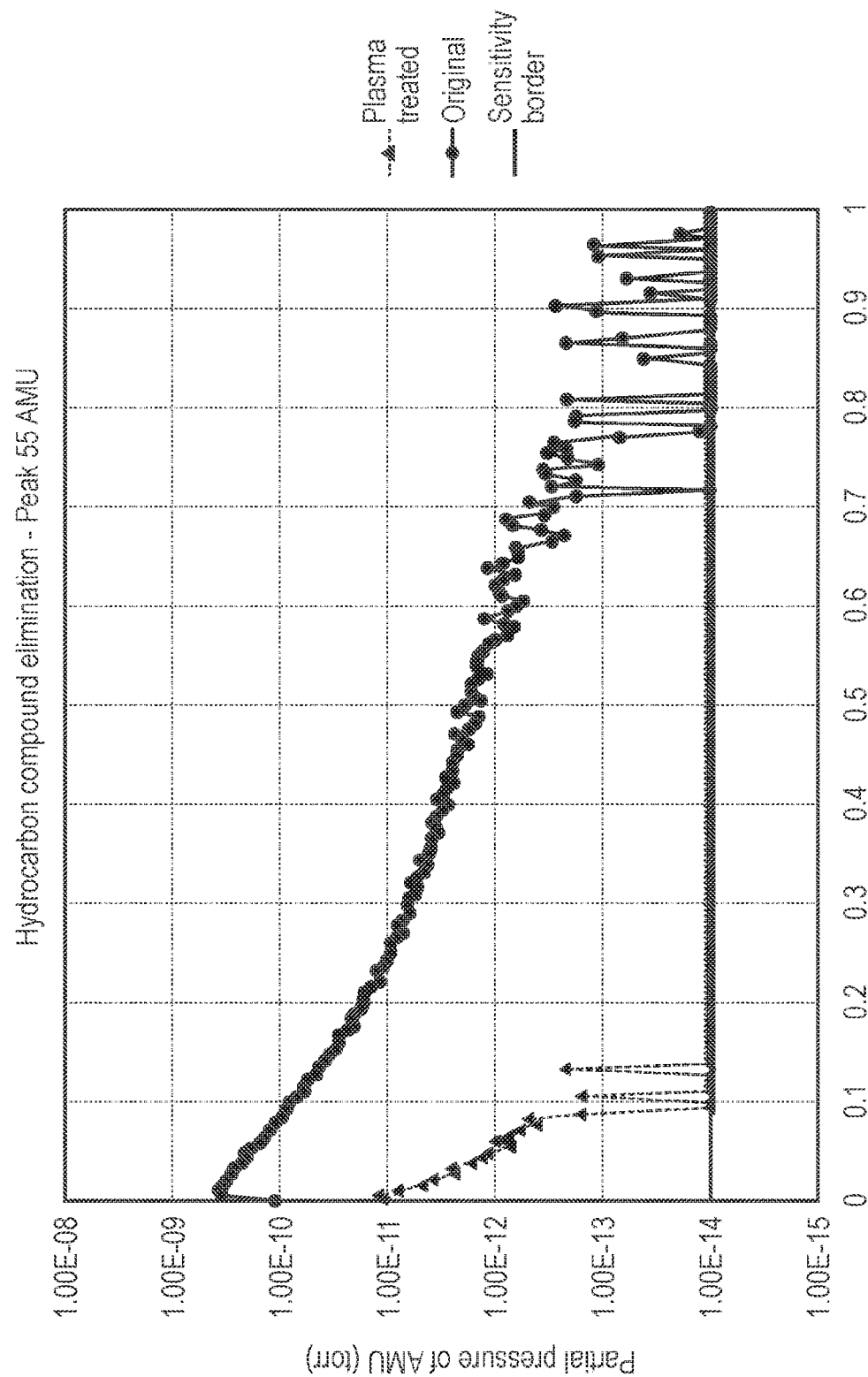
FIG. 3 provides a comparison between a sample treated according to the invention and an untreated sample.

As shown in FIG. 3, which shows the RGA results, in the case of the plasma cleaned turbomolecular pump, the peak for AMU55 ($C_4H_7$) reached the minimum detection limit of the apparatus (i.e. 1.00E-14 Torr) in less than 2 hours, whereas the untreated apparatus took approximately 18 hours.

Figure 4:
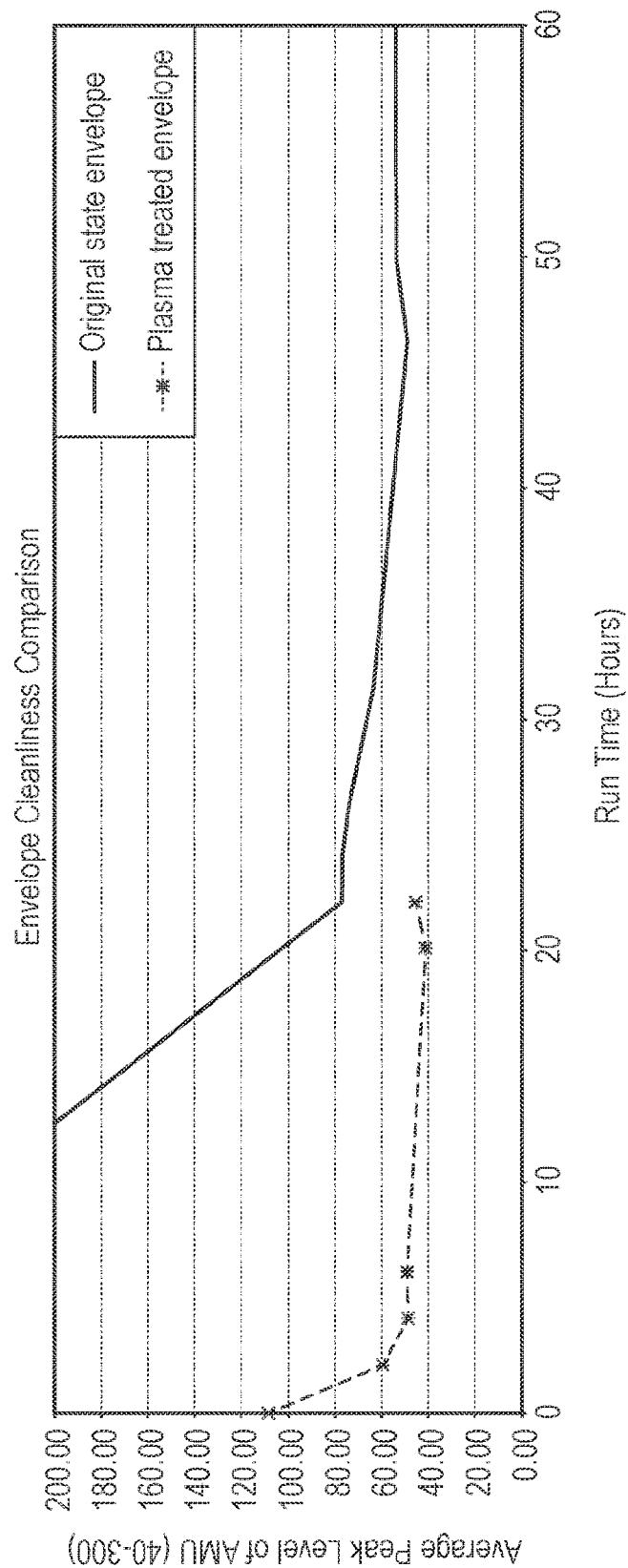
FIG. 4 provides a further comparison between a sample treated according to the invention and an untreated sample.

Likewise, as shown in FIG. 4, the plasma cleaned turbomolecular pump was sufficiently clean for use in mass-spectrometry after approximately 4 hours, whereas the untreated pump took about 48 hours of hot running to be similarly clean.

More than 30 vacuum assemblies were back to back tested to confirm the results. All plasma cleaned vacuum assemblies had highly reduced outgassing time compared to standard untreated assemblies.

It will be appreciated that various modifications may be made to the embodiments shown without departing from the spirit and scope of the invention as defined by the accompanying claims as interpreted under patent law.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

What is claimed:

1. A method, the method comprising the steps of:
    a) placing an ultra-high vacuum component in a vacuum furnace chamber;
    b) plasma cleaning the ultra-high vacuum component at a temperature from 80° C. to 125° C. and at a pressure greater than 10E-06 mbar to remove hydrocarbons from the ultra-high vacuum component, wherein during plasma cleaning, the temperature is prevented from exceeding 125° C.; and
    c) ceasing plasma cleaning and then evacuating the vacuum furnace chamber to reduce a pressure in the vacuum furnace chamber to less than 10E-06 mbar to cause the ultra-high vacuum component to outgas, wherein during evacuating, the temperature is prevented from exceeding 125° C.

2. The method according to claim 1, further comprising evacuating the vacuum furnace chamber to a pressure of less than 10E-6 mbar, after step a) but before step b).

3. The method according to claim 1, further comprising repeating steps b) to c), from 2 to 12 times.

4. The method according to claim 1 wherein a gas for forming the plasma is introduced to a pressure of from 0.1E+00 mbar to 1E+00 mbar, and/or at flow rate from 5 sccm to 20 sccm.

5. The method according to claim 1 wherein the vacuum furnace chamber has a volume of from 250 liters to 350 liters.

6. The method according to claim 1 wherein following step c) the component is cooled and nitrogen is introduced into the vacuum furnace chamber.

7. The method according to claim 1 wherein a plasma generator is used with a voltage frequency from 20 kHz to 40 kHz.

8. The method according to claim 1 wherein step b) lasts from 15 minutes to 35 minutes.

9. The method according to claim 1 wherein steps a), b) and c) together lasts from 15 minutes to 40 minutes.

10. The method according to claim 1 wherein step c) lasts from about 2 to about 4 hours.

11. The method according to claim 1 wherein the component is cleaned with a solvent before it is placed in the vacuum furnace chamber.

12. The method according to claim 1 wherein gas for forming the plasma is selected from the group consisting of oxygen, air, nitrogen, helium and argon.

13. The method according to claim 12 wherein the gas is oxygen.

* * * * *